US010829411B2

(12) United States Patent
Harada et al.

(10) Patent No.: US 10,829,411 B2
(45) Date of Patent: Nov. 10, 2020

(54) RECTANGULAR GLASS SUBSTRATE AND METHOD FOR PREPARING THE SAME

(71) Applicant: Shin-Etsu Chemical Co., Ltd., Tokyo (JP)

(72) Inventors: Daijitsu Harada, Joetsu (JP); Masaki Takeuchi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 79 days.

(21) Appl. No.: 15/685,520

(22) Filed: Aug. 24, 2017

(65) Prior Publication Data

US 2018/0057399 A1 Mar. 1, 2018

(30) Foreign Application Priority Data

Aug. 25, 2016 (JP) ................................ 2016-164213

(51) Int. Cl.
*C03C 19/00* (2006.01)
*B24B 9/00* (2006.01)
(Continued)

(52) U.S. Cl.
CPC .............. *C03C 19/00* (2013.01); *B24B 9/005* (2013.01); *B24B 9/10* (2013.01); *B24B 29/005* (2013.01);
(Continued)

(58) Field of Classification Search
CPC ...................................................... C03C 19/00
(Continued)

(56) References Cited

U.S. PATENT DOCUMENTS

2011/0129648 A1* 6/2011 Gu .......................... C03C 3/083 428/157
2013/0149494 A1 6/2013 Koike et al.
(Continued)

FOREIGN PATENT DOCUMENTS

GB 512159 A 8/1939
JP 7-186022 A 7/1995
(Continued)

OTHER PUBLICATIONS

Extended European Search Report for European Application No. 17186944.9, dated Feb. 1, 2018.
(Continued)

*Primary Examiner* — Brent T O'Hern
(74) *Attorney, Agent, or Firm* — Birch, Stewart, Kolasch & Birch, LLP

(57) ABSTRACT

A rectangular glass substrate has a front surface, a back surface, four side surfaces, and eight chamfered surfaces, and a thickness of at least 6 mm. A first curved surface along the edge line between the front surface and the chamfered surface disposed adjacent thereto has an average gradient of up to 25% in a range from the front surface to a position of 50 μm below the front surface when the substrate is rested horizontal with the front surface facing upward. A second curved surface along the edge line between at least one of four side surfaces and the chamfered surface disposed adjacent to the front surface has an average gradient of at least 30% in a range from the at least one side surface to a position of 50 μm below the at least one side surface when the substrate is rested horizontal with the at least one side surface facing upward.

6 Claims, 4 Drawing Sheets

(51) Int. Cl.

| | |
|---|---|
| ***B24B 9/10*** | (2006.01) |
| ***B24B 29/00*** | (2006.01) |
| ***C03C 21/00*** | (2006.01) |
| ***H01L 21/02*** | (2006.01) |
| ***H01L 29/06*** | (2006.01) |
| *C03C 3/06* | (2006.01) |
| *C03C 23/00* | (2006.01) |

(52) U.S. Cl.
CPC ........ *C03C 21/00* (2013.01); *H01L 21/02422* (2013.01); *H01L 29/06* (2013.01); *C03C 3/06* (2013.01); *C03C 23/0075* (2013.01)

(58) Field of Classification Search
USPC .......................................................... 428/141
See application file for complete search history.

(56) References Cited

U.S. PATENT DOCUMENTS

| | | | |
|---|---|---|---|
| 2014/0170387 | A1 | 6/2014 | Kashima et al. |
| 2015/0097304 | A1 | 4/2015 | Koike et al. |
| 2016/0052193 | A1 | 2/2016 | Okafuji et al. |
| 2016/0280590 | A1 | 9/2016 | Kashima et al. |
| 2018/0079130 | A1 | 3/2018 | Okafuji et al. |

FOREIGN PATENT DOCUMENTS

| | | | |
|---|---|---|---|
| JP | 11-109607 | A | 4/1999 |
| JP | 2005-316448 | A | 11/2005 |
| JP | 2008-257131 | A | 10/2008 |
| JP | 2008-302448 | A | 12/2008 |
| JP | 2011-84453 | A | 4/2011 |
| JP | 2012-27176 | A | 2/2012 |
| JP | 2012-111661 | A | 6/2012 |
| JP | 2016-43692 | A | 4/2016 |
| JP | 2016-113356 | A | 6/2016 |
| WO | WO 2011/066246 | A1 | 6/2011 |
| WO | WO 2012/008343 | A1 | 1/2012 |
| WO | WO 2013/031548 | A1 | 3/2013 |

OTHER PUBLICATIONS

Japanese Office Action issued in the corresponding Japanese Patent Application No. 2017-157802 dated May 26, 2020.

* cited by examiner

RECTANGULAR GLASS SUBSTRATE AND METHOD FOR PREPARING THE SAME

CROSS-REFERENCE TO RELATED APPLICATION

This non-provisional application claims priority under 35 U.S.C. § 119(a) on Patent Application No. 2016-164213 filed in Japan on Aug. 25, 2016, the entire contents of which are hereby incorporated by reference.

TECHNICAL FIELD

This invention relates to a rectangular glass substrate for main use as semiconductor-related electronic material, and especially a synthetic quartz glass substrate for photomasks and a rectangular glass substrate for nanoimprint lithography in advanced applications, and a method for preparing the same.

BACKGROUND ART

Typical defects on glass substrates include damages such as pits and scratches and protruding defects such as contaminants and firmly adhered particles. When a film is deposited on glass substrates having stuck to their surface contaminants or particles originating from residues after polishing steps and contamination in cleaning steps, the contaminants or particles may cause short-circuiting and partial loss of interconnects during film patterning. It is thus important that the contaminants or particles be removed in cleaning steps of glass substrates.

Patent Document 1 discloses a glass substrate in which edge line portions where the front and back surfaces respectively intersect with the chamfered surfaces disposed adjacent thereto, and edge line portions where the side surfaces respectively intersect with the chamfered surfaces disposed adjacent thereto are further chamfered into rounded edge line portions (i.e., a curvature radius R of 0.01 to 0.3 mm) in order to prevent the substrate from cracking or chipping in the fabrication step and to facilitate removal of foreign matter during cleaning.

Patent Document 2 proposes a glass substrate having a chamfered surface which is rounded to a curvature radius of at least 50 pun at a tangential point of the chamfered surface with a straight line tilted at 45° relative to the main flat surface and a curvature radius of 20 to 500 μm or larger at a tangential point of the chamfered surface with a straight line tilted at 15° relative to the main flat surface, in order that the glass substrate have a high impact fracture strength.

Patent Document 3 discloses a glass substrate having a chamfered surface which possesses a root-mean-square slope of roughness curve of up to 0.10 expressed by index RΔq for the purposes of preventing the occurrence of breakage due to deflection or an improper temperature distribution of the glass substrate and solving the problem of particles at the same time.

Patent Document 4 proposes a mask blank-forming substrate having a chamfered surface which has a flatness of up to 50 μm, a surface roughness of up to 2 nm, and a convex shape that the height gradually decreases from the center region toward the periphery, for the purposes of improving the uniformity of in-plane film thickness of a resist film and preventing dusting due to any bulging of the resist film.

CITATION LIST

Patent Document 1: JP-A H11-109607
Patent Document 2: WO 2013/031548

Patent Document 3: JP-A 2011-084453
Patent Document 4: JP-A 2008-257131

SUMMARY OF INVENTION

Recently, a high-sensitivity defect inspection instrument has been developed which is able to detect flaws, particles, and contaminants sized in the order of 100 nm. Even when glass substrates are cleaned by well-known glass cleaning methods such as dip-cleaning and single-substrate cleaning, some glass substrates are detected to have particles or contaminants deposited thereon, giving rise to the problem of a product yield decline.

In Patent Document 1, when the front surface of the substrate which has been cleaned by a single-substrate cleaning apparatus and spin dried is inspected, particles having a visually observable size of 1 μm or greater are not found, but contaminants of 100 nm size are detected as deposited in a region close to the side surface.

The substrate of Patent Document 2 has more rounded edged lines than the substrate of Patent Document 1. When this substrate is cleaned by a single-substrate cleaning apparatus which always supplies fresh water or chemical solution to every single substrate and dried, the front surface of the substrate tends to have relatively fewer contaminants of 100 nm size. On the other hand, when the substrate is cleaned by dip-cleaning where a plurality of substrates are vertically placed in a chemical-resistant, special cassette and the cassette is immersed in a bath filled with chemical solution, the front surface of the substrate sometimes has many contaminants of 100 nm size. This is because the liquid of the final cleaning bath remaining on the side surface after drying runs to the front surface.

Even in the case of a glass substrate having smooth side surfaces as described in Patent Document 3, the front surface of the glass substrate may bear many contaminants of 100 nm size after single-substrate cleaning and/or dip-cleaning, depending on the shape of the edge line between the chamfered surface and the front surface and the edge line between the chamfered surface and the side surface.

In the case of a substrate having a chamfered surface with a flatness of up to 50 μm and a convex shape that the height gradually decreases from the center region toward the periphery as described in Patent Document 4, the extent of contamination is affected by the shape of the edge line between the chamfered surface and the front surface and the edge line between the chamfered surface and the side surface, like Patent Document 3. Limiting the surface roughness of the chamfered surface to a low value is expected to be effective for contamination prevention to some extent because few abrasive grains are trapped. If side surfaces are polished with a common brush as described in Patent Document 4, then the edge line between the chamfered surface and the front surface and the edge line between the chamfered surface and the side surface are given a certain area. Limiting only the surface roughness of the chamfered surface is not fully effective in some cases.

An object of the invention is to provide a glass substrate for main use as semiconductor-related electronic material, having a curved surface of predetermined shape in the vicinity of a chamfered surface disposed adjacent to a front surface, capable of preventing surface contamination of submicron size after cleaning, independent of the type of cleaning, and suppressing any decline of production yield, and a method for preparing the same.

The inventors have found that the above problems are solved when a rectangular glass substrate having a front surface, a back surface, four side surfaces, and eight chamfered surfaces defined between the front surface and the side surfaces and between the back surface and the side surfaces is provided with a curve surface having a predetermined average gradient along the edge line between the front surface and the chamfered surface disposed adjacent thereto and the edge line between the side surface and the chamfered surface disposed adjacent to the front surface.

In one aspect, the invention provides a rectangular glass substrate having a front surface, a back surface, four side surfaces, and eight chamfered surfaces defined between the front surface and the side surfaces and between the back surface and the side surfaces. The substrate has a thickness of at least 6 mm. The substrate includes a first curved surface along the edge line between the front surface and the chamfered surface disposed adjacent thereto, having an average gradient of up to 25% in a range from the front surface to a position of 50 μm below the front surface when the substrate is rested horizontal with the front surface facing upward. The substrate also includes a second curved surface along the edge line between at least one of four side surfaces and the chamfered surface disposed adjacent to the front surface, having an average gradient of at least 30% in a range from the at least one side surface to a position of 50 μm below the at least one side surface when the substrate is rested horizontal with the at least one side surface facing upward. That is, for at least one side surface, the second curved surface should have the specific average gradient.

In a preferred embodiment, the first curved surface has an arithmetic average roughness (Sa) of up to 2 nm.

In a preferred embodiment, the arithmetic average roughness (Ra) of roughness curve between the side surface and the chamfered surface disposed adjacent to the front surface is up to 0.1 μm.

In a preferred embodiment, the front surface of the substrate excluding a region extending 2 mm inside from its outer periphery has a flatness of up to 5 μm.

In another aspect, the invention provides a method for preparing the rectangular glass substrate defined above, comprising the steps of stacking a plurality of starting rectangular glass substrates having side surfaces and chamfered surfaces ground, in a spaced-apart relationship such that the front surface of one substrate is opposed to the back surface of an adjacent substrate, and polishing the side surfaces and chamfered surfaces of the stacked starting substrates with a brush. The brush comprises a cylindrical base and a multiplicity of bristles extending radially from the base, each bristle having a diameter of up to 0.2 mm. The spacing between starting substrates is 2 to 10 times the bristle diameter.

The method may further comprise the step of polishing the side surfaces of the stacked starting substrates by abutting a platen having a polishing pad secured thereto against the side surfaces.

Advantageous Effects of Invention

The glass substrate of the invention is capable of preventing surface contamination of submicron size after cleaning, independent of the type of cleaning, and suppressing any decline of production yield.

DESCRIPTION OF PREFERRED EMBODIMENTS

The invention pertains to a rectangular glass substrate having a front surface, a back surface opposed thereto, four side surfaces between the front and back surfaces, and eight chamfered surfaces defined between the front surface and the side surfaces and between the back surface and the side surfaces. The substrate includes a first curved surface along the edge line between the front surface and the chamfered surface disposed adjacent thereto, having an average gradient of up to 25% in a range from the front surface to a position spaced 50 μm below or inside the front surface when the substrate is rested horizontal with the front surface facing upward. The substrate includes a second curved surface along the edge line between at least one of four side surfaces and the chamfered surface disposed adjacent to the front surface, having an average gradient of at least 30% in a range from the at least one side surface to a position spaced 50 μm below or inside the at least one side surface when the substrate is rested horizontal with the at least one side surface facing upward. The substrate has a thickness of at least 6 mm.

In the rectangular glass substrate of the invention, the curved surface of the above-defined shape is formed in the vicinity of the chamfered surface disposed adjacent to the front surface, but no particular limits are imposed to the shape or contour of the chamfered surface disposed adjacent to the back surface and the vicinity.

Figure 1:
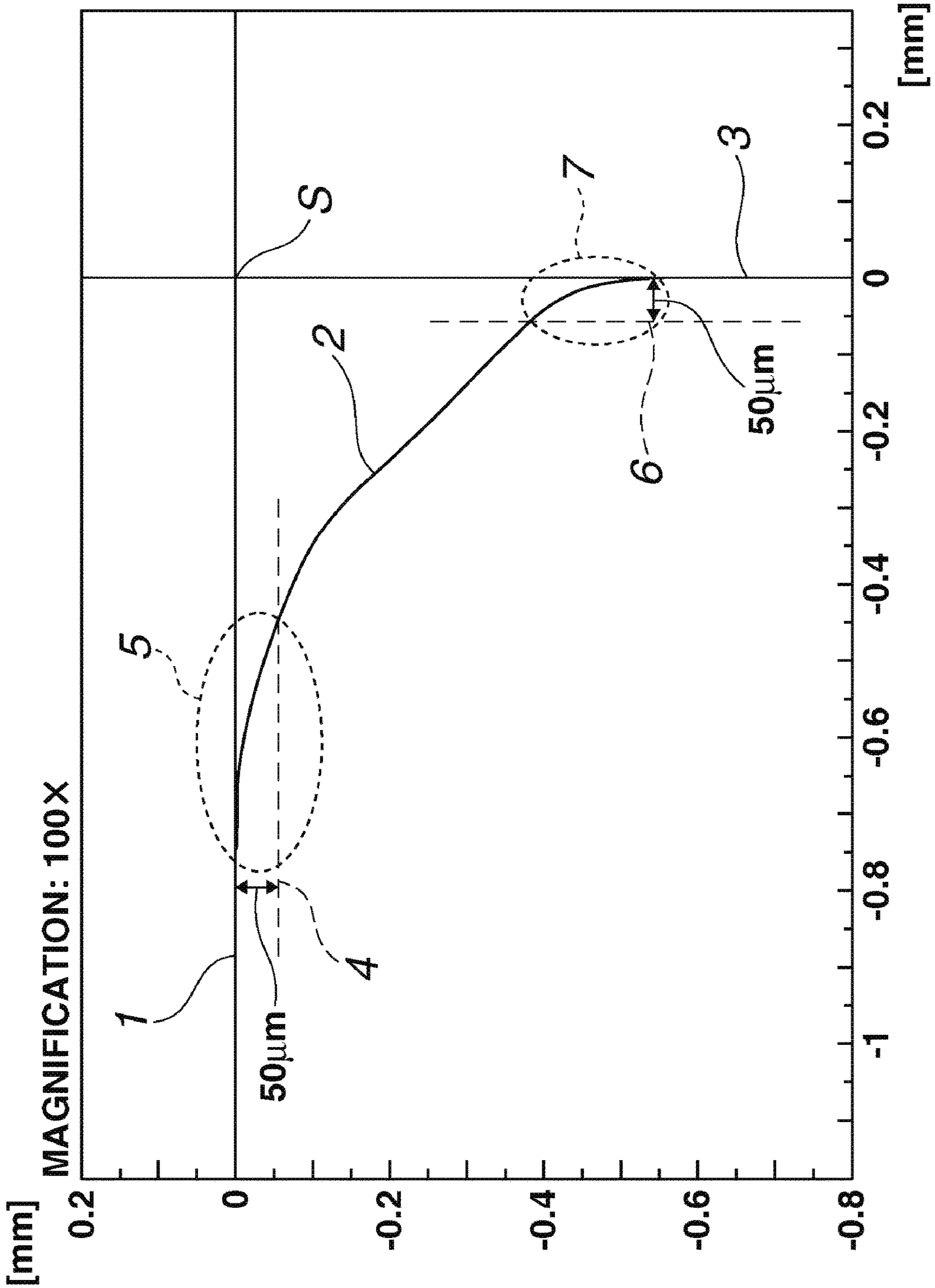
FIG. 1 is a profile obtained by measuring the shape from the front surface to the side surface via the chamfered surface of a rectangular glass substrate according to the invention.

FIG. 1 shows a profile of a rectangular glass substrate in a cross section normal to the front and back surfaces, the profile being obtained by measuring the shape of the substrate ranging from the front surface to the side surface past the chamfered surface. Each of the side surfaces includes a plane which is perpendicular to a plane including the front surface and a plane including the back surface in the rectangular glass. The rectangular glass substrate is illustrated in FIG. 1 as having a front surface 1, a chamfered surface 2 disposed adjacent to the front surface, a side surface 3, a position 4 disposed 50 μm below (or inside) the front surface, a first curved surface 5 ranging between the front surface and the position 4 of 50 μm below the front surface, a position 6 disposed 50 μm below (or inside) the side surface, and a second curved surface 7 ranging between the side surface and the position 6 of 50 μm below the side surface. When the rectangular glass substrate is rested horizontal with the front surface facing upward, the "average gradient" in a range from the front surface to the position of 50 μm below the front surface refers to an average gradient of the first curved surface 5 in FIG. 1. According to the invention, the average gradient of the first curved surface 5 is up to 25%, preferably up to 23%, and more preferably up to 20%. Although the lower limit of average gradient is not critical, it is preferably at least 15% because the flatness of the front surface is degraded if the first curved surface extends further to the front surface side.

With respect to rectangular glass substrates, the inventors first investigated how surface contamination is affected by the magnitude of the average gradient of the first curved surface along the edge line extending between the front surface and the chamfered surface disposed adjacent thereto. In a single-substrate cleaning system wherein a rectangular glass substrate is cleaned, while the front surface of the substrate is rested horizontal, to remove many types of contaminants such as organics, metal impurities, and residual abrasives on the front surface, various chemical solutions are used in combination corresponding to a particular type of contaminant. As one of the causes for surface contamination, the influence of pH or surface potential upon exchange of chemical solutions is contemplated. For example, an acidic chemical solution is supplied to dissolve away contaminants which have adhered to the front surface. Sometimes, the dissolved contaminants on the glass substrate are not completely discharged out of the system. If an alkaline chemical solution is supplied in this state, then the dissolved contaminants will form salts, precipitate and adhere again to the glass substrate. The single-substrate cleaning system operates on the mechanism that a chemical solution is supplied to the substrate while rotating the substrate whereby the dissolved contaminants are centrifugally discharged out of the system. The substrate is rotated at a relatively low speed of several tens to several hundreds rpm because the surface will dry up at a high rotational speed. If the substrate has too sharp a gradient between the front surface and the chamfered surface, contaminants dissolved in a chemical solution may stay on the front surface close to the chamfered surface due to the surface tension of the solution. When several types of chemical solutions are used in single-substrate cleaning, separate cleaning baths are typically assigned in the cleaning machine. The rotation of the glass substrate must be stopped when the substrate is transferred from one cleaning bath to a next bath. Since the centrifugal force is lost at the timing of stopping rotation, contaminants staying near the boundary between the front surface and the chamfered surface start to run toward the center of the front surface. When the glass substrate in this state is contacted with a chemical solution having a different pH or surface potential in the next cleaning bath, the contaminants may form salts and precipitate on the front surface of the glass substrate as protruding deposits. For the purposes of discharging the dissolved contaminants out of the system by a centrifugal force despite low speed rotation and preventing precipitation of protruding deposits on the front surface, the first curved surface between the front surface and the position of 50 μm below the front surface is given an average gradient of up to 25%.

When the rectangular glass substrate is rested horizontal with at least one of four side surfaces facing upward, the average gradient of the second curved surface ranging from the at least one side surface to the position of 50 μm below the at least one side surface refers to an average gradient of the second curved surface 7 in FIG. 1. The curved surface is preferably defined along the edge line connecting each of the four side surfaces and the chamber disposed adjacent to the front surface. The average gradient of the second curved surface 7 is at least 30%, preferably at least 35%, and more preferably at least 40%. Although the upper limit of average gradient is not critical, it is preferably up to 48% because a glass substrate having too sharp a gradient may be prone to crack or chip upon contact with a jig.

The inventors also investigated how surface contamination is affected by the magnitude of the average gradient of the second curved surface extending from the side surface to the chamfered surface disposed adjacent to the front surface. In a dip-cleaning system wherein the glass substrate is cleaned with the side surface rested horizontal, a strong possibility of surface contamination is during the drying step following the cleaning step. Examples of the drying step used in the dip-cleaning system include withdrawal from hot DI water, Marangoni drying, and vapor heat drying. In these drying methods, vertically oriented glass substrates are withdrawn from within the bath. Although the majority of water or chemical solution which has been present in the vicinity of the side surface in the bath runs down along the still wet front surface at the instant of withdrawal, some water or chemical solution may remain on the side surface during or after withdrawal. Since the water or chemical solution is at a high temperature in the drying step, the water or chemical solution remaining on the side surface mostly evaporates off as vapor. However, depending on vibration of the cleaning machine or a tilt of the substrate or the cleaning cassette, the water or chemical solution remaining on the side surface may not vaporize and run down to the front surface side. In this case, the water or chemical solution is hot and contains contaminants, which have been present on the side surface or in the bath, in a concentrated state. When such contaminated water or chemical solution runs on the front surface of the substrate, it may be dried and deposited as contaminants on the front surface before running off the front surface. For the purpose of allowing the water or chemical solution remaining on the side surface to stay thereon due to surface tension during or after withdrawal, despite vibration of the cleaning machine or a tilt of the substrate or the cleaning cassette, for thereby preventing the water or chemical solution from running to the front surface of the substrate and adhering thereto as contaminants, the second curved surface ranging from the side surface to the position of 50 μm below the side surface is given an average gradient of at least 30%.

The shape between the front surface and the chamfered surface disposed adjacent thereto and the shape between the side surface and the chamfered surface disposed adjacent to the front surface may be measured by a contact profilometer or a contact or non-contact (e.g., laser displacement type) coordinate measuring machine. For example, using the profile of a curved surface measured by a surface texture and contour measuring instrument Surfcom 1900 available from Tokyo Seimitsu Co., Ltd., the average gradient of the curved surface between the front surface and the position of 50 μm below the front surface may be determined as follows. The front surface is horizontally leveled and aligned with X-axis, and the position of 50 μm below the front surface is determined on Y-axis. Then, a distance change in X-direction from the point where the front surface leaves X-axis to the point of 50 μm below the front surface is determined. The average gradient is calculated by dividing 50 μm by the distance change in X-direction.

The rectangular glass substrate of the invention should have a thickness of at least 6 mm. A substrate of thinner than 6 mm has a smaller side surface width, which means that the amount of liquid remaining on the side surface is reduced, the concern of surface contamination is minimized, and the average gradient need not be considered.

The substrate is preferably a rectangular synthetic quartz glass substrate having sides of 150 to 300 mm long, which may contain 0.1 to 20% by weight of titania.

When the rectangular glass substrate is rested horizontal with the front surface facing upward, the first curved surface 5 in FIG. 1 extending from the front surface to the position of 50 μm below the front surface has an arithmetic average roughness (Sa) of preferably up to 2 nm, more preferably up to 1 nm, even more preferably up to 0.5 nm, and most preferably up to 0.3 nm, as viewed from easy removal of contaminants. Notably Sa is determined according to ISO 25178.

The roughness curve between the side surface and the chamfered surface disposed adjacent to the front surface of the substrate has an arithmetic average roughness (Ra) of preferably up to 0.1 μm, more preferably up to 0.05 μm, and even more preferably up to 0.025 μm from the aspect of preventing contaminants from remaining. Notably Ra is determined according to JIS B0601-1994.

Essentially, Sa which is a parameter of surface is adequate in evaluating the likelihood of contaminants or liquid being left behind. In an attempt to measure the side surface and the chamfered surface of a substrate, the substrate is kept upright on a stage, and a measurement object is positioned at a height which is spaced from the stage by the longitudinal or transverse size of the substrate. In this situation, measurement by an AFM meter capable of measuring and computing two-dimensional Sa is difficult due to restrictions of the movable range of the meter, whereas a contact profilometer capable of computing one-dimensional Ra is relatively easy to measure even at the height which is spaced from the stage by the longitudinal or transverse size of the substrate. For this reason, the curved surface is prescribed in terms of Ra.

It is preferred from the aspect of easy removal of contaminants that the front surface of the rectangular glass substrate have an arithmetic average roughness (Sa) of up to 0.3 nm, more preferably up to 0.2 nm.

From the aspect of liquid discharge, the front surface excluding a region extending 2 mm inside from the outline of the rectangular glass substrate preferably has a flatness of up to 5 μm, more preferably up to 3 μm, and even more preferably up to 1 μm. When the rectangular glass substrates are used especially in advanced applications such as photomask and nanoimprint applications, high positional accuracy and uniformity may be required in exposure and transfer processes. As used herein, a distance from the outline refers to a distance from the intersection S between a line extending from the front surface 1 and a line extending from the side surface 3 in FIG. 1. The flatness is defined as a flatness of the front surface excluding a region extending 2 mm inside from the intersection S. Any flatness measurement method may be used. For example, optical interference flatness measurement is suited. The flatness may be measured using an optical interference flatness meter Ultra Flat M200 by TROPEL, for example.

Now, the method for preparing a rectangular glass substrate is described.

The method involves the steps of furnishing a plurality of starting rectangular glass substrates having a side length of 150 to 300 mm, lapping the front and back surfaces, and grinding the side surfaces and chamfered surfaces. For example, 10 to 100 thus machined substrates are stacked in a spaced-apart relationship such that the front surface of one substrate is opposed to the back surface of an adjacent substrate. In this stacked state, the side surface and chamfered surface are polished with a brush. Brush polishing a stack of substrates has advantages including high productivity and easy control of the average gradient of the first curved surface between the front surface and the chamfered surface disposed adjacent thereto of the substrate.

The brush used herein includes a solid or hollow cylindrical base and a multiplicity of bristles extending radially from the side surface of the base. Each bristle has a diameter of up to 0.2 mm, preferably up to 0.1 mm, and more preferably up to 0.09 mm. If the bristle diameter exceeds 0.2 mm, the bristles become too strong and hard and cause uneven polishing to the side surface and chamfered surface; then the arithmetic average roughness of the roughness curve is increased; the propensity that contaminants remain on unevenly polished portions and rough surface portions increases, causing surface contamination of the rectangular glass substrate. Although the lower limit of the bristle diameter is not critical, it is preferably at least 0.01 mm.

Figure 3:
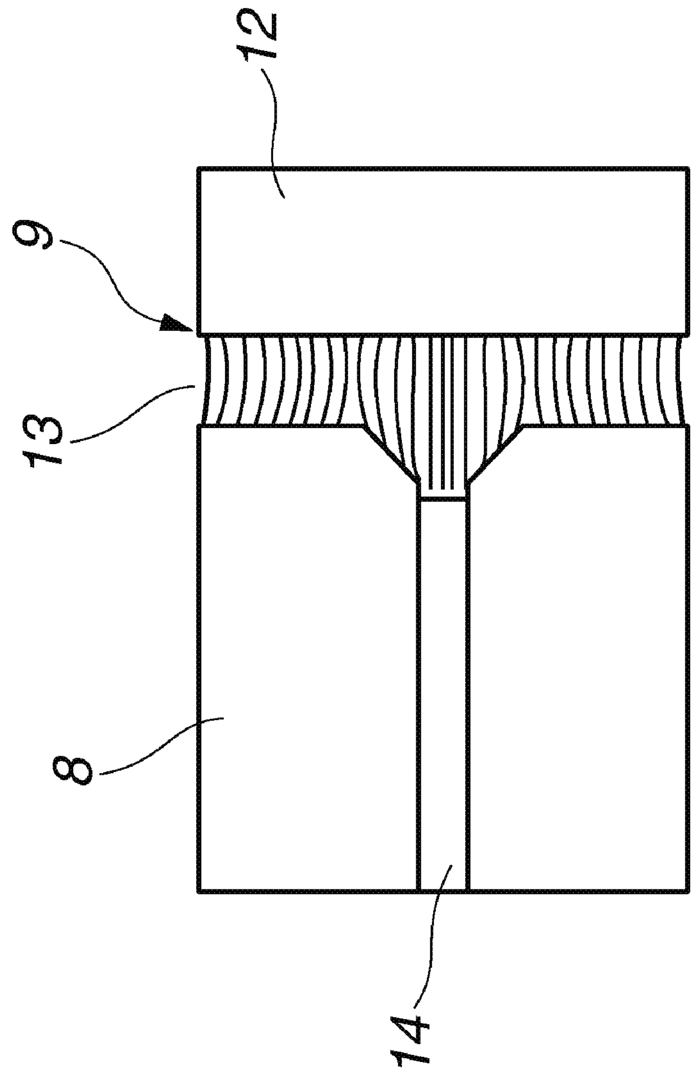
FIG. 3 is an enlarged side view showing a portion near side surfaces and chamfered surfaces in the step of polishing the side and chamfered surfaces of rectangular glass substrates with a brush in one embodiment of the inventive method.

The brush may be of any design. One exemplary brush is depicted at 9 in FIG. 3 as comprising a cylindrical base 12 having a diameter of 30 to 300 mm and a length of 50 to 300 mm and bristles 13 in the form of short filaments having a length of 10 to 50 mm which are radially anchored to the side surface of the base in a density of 1 to 10 filaments/$mm^2$. It is noted that only bristles in contact with the side surface of starting substrates 8 are illustrated in FIG. 3. The material of the bristles is preferably a resin or animal hair, for example, polyethylene, polypropylene, nylon, acrylic resin, melamine resin, and wool.

In brush polishing, the spacing (sometimes referred to as "stacked spacing" hereinafter) between glass substrates which are stacked such that the front surface of one substrate is opposed to the back surface of an adjacent substrate is 2 to 10 times, preferably 2.5 to 7.5 times the bristle diameter. If the stacked spacing is less than 2 times the bristle diameter, the bristles at their end may not fully enter the spacing and fail in sufficient polishing between the chamfered surface and the front surface, with difficulty to define the desired curved surface on the edge line between the front surface and the chamfered surface. That is, it is difficult to produce a substrate which includes the first curved surface between the front surface and the position of 50 μm below the front surface having an average gradient of up to 25% when the substrate is rested horizontal with the front surface facing upward. If the polishing time is prolonged so as to form a curved surface, the polishing between the chamfered surface and the side surface is concurrently promoted, resulting in a curved surface having a larger average gradient between the front surface and the chamfered surface. As a result, the second curved surface between the side surface and the position of 50 μm below the side surface has an average gradient of less than 30% when the substrate is rested horizontal with the side surface facing upward.

If the stacked spacing is more than 10 times the bristle diameter, the staked spacing is too wide and the number of substrates which can be polished on the side surface and chamfered surface at a time is reduced, resulting in a decline of productivity. In the case of wide stacked spacing, less bristles may come in contact between the front surface and the chamfered surface and provide insufficient polishing between the front surface and the chamfered surface, with a difficulty to define the desired curved surface on the edge line between the front face and the chamfered surface, though this case is not so outstanding as in the case of narrow stacked spacing.

The stacked spacing may be controlled in any way, for example, by inserting a uniform thickness sheet 14 made of a resin such as nylon, polypropylene or polyethylene or paper between substrates, as shown in FIG. 3. The resin or paper sheet preferably has a length and width which are 10 mm (or less) shorter than the length and width of the substrate and is desirably aligned with the substrate, as considered from the aspect of preventing substrates from mutual contact to cause damages to the front surface.

Figure 2A:
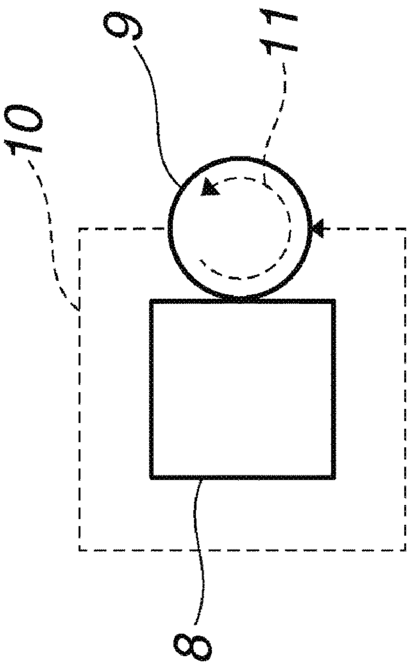
FIGS. 2A and 2B schematically illustrate the step of polishing the side surface and chamfered surface of rectangular glass substrates with a brush in one embodiment of the inventive method, FIG. 2A being a plan view and FIG. 2B being a perspective view.
Figure 2B:
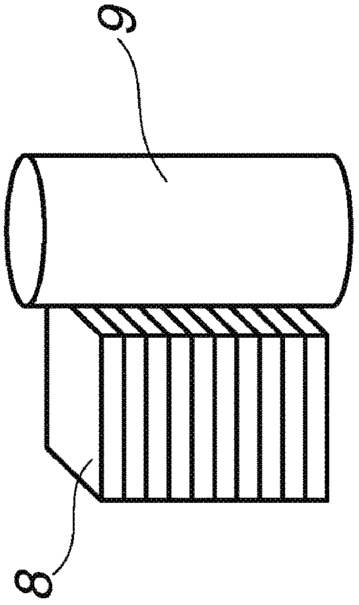

Referring to FIGS. 2 and 3, the method for polishing the side surface and chamfered surface of glass substrates with a brush is described. The brush 9 is placed such that the bristles 13 abut against the side surface and chamfered surface of the side surface-ground rectangular glass substrates 8 at a depth of 1 to 30 mm from the bristle end as shown in FIG. 3. The relationship of the stack of starting glass substrates 8 and the brush 9 is shown in FIG. 2B. While the brush 9 is rotated in the direction of an arrow 11 in FIG. 2A at a rotational speed of 100 to 5,000 rpm, and the bristles at their end continuously contact with the side surface and chamfered surface of starting glass substrates, an abrasive is fed to the interface for thereby polishing the side surface and chamfered surface. For the purpose of polishing all the side surfaces and chamfered surfaces defining the outer periphery of the substrate with the brush, the brush may be moved around the outer periphery of the substrates along a path 10 in FIG. 2A at a speed of 10 to 1,000 mm/min, or a reciprocal mechanism of moving the brush back and forth along one side of the substrates at a speed of 10 to 1,000 mm/min may be used in combination with a mechanism of rotating the substrate stack 90° each time.

Examples of the abrasive used in the brush polishing step include cerium oxide, zirconium oxide, manganese oxide, iron oxide, and colloidal silica.

Figure 4:
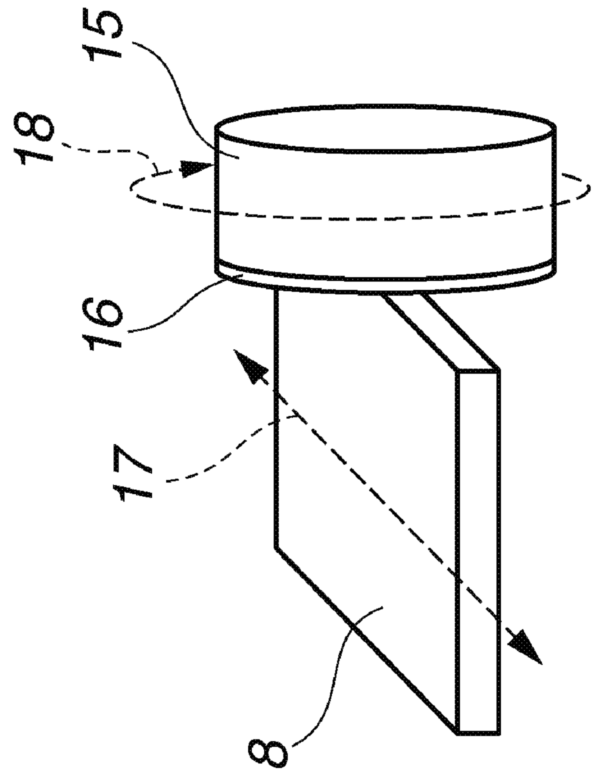
FIG. 4 is a schematic view showing a method for polishing the side surface of a rectangular glass substrate with a platen having a polishing pad secured thereto in another embodiment of the inventive method.

After the brush polishing step, the side surface and chamfered surface of the glass substrate may be further polished by abutting a platen having a polishing pad secured thereto with a polishing slurry containing abrasives being supplied. This enables to control the average gradients of the first curved surface on the edge line between the front surface and chamfered surface disposed adjacent thereto and the second curved surface between the side surface and chamfered surface disposed adjacent to the front surface to fall in the desired ranges. As shown in FIG. 4, the side surface and chamfered surface of the substrate are polished by abutting a platen 15 having a polishing pad 16 secured thereto against the side surface under a pressure of 10 to 300 gf/cm$^2$, rotating the platen at 5 to 100 rpm in a direction 18 parallel to the abutted surface, and moving the platen or the substrate back and forth at a speed of 10 to 1,000 mm/min in a longitudinal direction 17 parallel to the abutted surface, until the side surface and chamfered surface reach a relatively high flatness. When both the average gradients between the front surface and the chamfered surface and between the side surface and the chamfered surface of the substrate become too small, the average gradient of the latter may be increased by polishing only the side surface with the polishing pad-bearing platen. Examples of the polishing pad used herein include a rigid polyurethane pad, non-woven fabric pad impregnated with polyurethane, and epoxy pad. Examples of the abrasive used herein include cerium oxide, zirconium oxide, aluminum oxide, manganese oxide, and iron oxide.

Before or after the step of polishing the side surface and chamfered surface, the front surface is subjected to rough polishing and final polishing before the glass substrate is finished into a final product. The rough polishing step may use a polishing pad of rigid polyurethane foam or the like in combination with an abrasive of cerium oxide or the like. The final polishing step may use a polishing pad of suede type soft polyurethane or the like in combination with an abrasive of colloidal silica or the like. The rough polishing and final polishing may be carried out using a single- or double-side polishing machine. The polishing step of the side surface and chamfered surface may be conducted prior to the rough polishing and final polishing of the front surface or between the rough polishing and the final polishing of the front surface.

By controlling the polishing pressure, the hardness of the polishing pad such as suede type soft polyurethane, the length of nap layer or the like in the final polishing step of the front surface, the arithmetic average roughness (Sa) of the first curved surface (depicted at 5 in FIG. 1) ranging from the front surface to the position of 50 μm below the front surface when the glass substrate is rested horizontal with the front surface facing upward can be controlled.

By increasing the depth of polishing pad of suede type soft polyurethane or the like submerged during polishing of the front surface, that is, by submerging the polishing pad to a depth of at least 50 μm, preferably at least 100 μm in the thickness direction from the substrate front surface, the first curved surface ranging from the front surface to the position of 50 μm below the front surface when the substrate is rested horizontal with the front surface facing upward is polished equally to the front surface and given an arithmetic average roughness (Sa) approximate to the level of the front surface after the final polishing.

The polishing pad used in the final polishing step has a hardness of preferably up to 60, more preferably up to 57, and even more preferably up to 55 on Asker C hardness scale, with the lower limit being typically at least 40. The nap layer of the polishing pad has a length of preferably at least 350 μm, more preferably at least 400 μm, even more preferably at least 450 μm, and preferably up to 1,000 μm, more preferably up to 700 μm.

The polishing pressure is preferably at least 50 gf/cm$^2$, more preferably at least 75 gf/cm$^2$, and even more preferably at least 100 gf/cm$^2$ and typically up to 500 gf/cm$^2$.

At the end of processing, the substrate is cleaned in a conventional way.

EXAMPLE

Examples and Comparative Examples are given below for further illustrating the invention although the invention is not limited thereto.

Example 1

Hundred (100) starting rectangular substrates having outer dimensions of 152 mm were furnished by slicing a synthetic quartz glass ingot. The front and back surfaces of starting substrates were lapped. The side surfaces and corners were ground and chamfered using a diamond wheel #800 to define side surfaces and chamfered surfaces. Four side surfaces were mirror finished using a brush in combination with an abrasive, thereby defining side surface and chamfered surface contours. The brush consisted of a base with a diameter 200 mm and a length 150 cm and nylon bristles with a diameter 60 μm, a length 20 mm, and a density 3 bristles/mm$^2$, and the abrasive was a cerium oxide-based abrasive A-10 (Showa Denko K.K.). Specifically, 100 glass substrates were stacked at a spacing of 500 μm (corresponding to 8.3 times the bristle diameter). The brush was placed such that the bristles abutted against the side surface of stacked substrates to a depth of about 8 mm from the bristle end. While the brush was rotated at 1,000 rpm, it was moved back and forth along one side surface at a speed of 200 mm/min. The mirror finishing was performed for 5 minutes on each side surface.

At the end of side surface mirror finishing, each substrate had a thickness of about 6.45 mm. Ten substrates were randomly taken out of 100 substrates and measured for the shape of the chamfered surface and the vicinity by a surface texture and contour measuring instrument Surfcom 1900 (Tokyo Seimitsu Co., Ltd.). The average gradient of the first curved surface ranging from the front surface to the position of 50 μm below the front surface was 21% at maximum among 10 substrates when the substrate was rested horizontal with the front surface facing upward. When the substrate was rested horizontal with at least one of four side surfaces facing upward, the average gradient of the second curved surface ranging from the at least one side surface to the position of 50 μm below the at least one side surface was 40% at minimum among 10 substrates.

Thereafter, the substrates on their front and back surfaces were subjected to rough polishing using a double-side polishing machine, a rigid polyurethane foam polishing pad, and a cerium oxide-based abrasive (A-10 by Showa Denko K.K.) and then to final precise polishing using a double-side polishing machine, a suede type soft polyurethane polishing pad (N0092 by Filwel Co., Ltd., Asker C hardness 55, nap layer length 550 μm), and a colloidal silica abrasive (Compol 80 by Fujimi Inc.). In the final precise polishing, the depth of polishing pad submerged was 120 μm and the polishing pressure was 150 g/cm$^2$.

After the completion of polishing, 10 substrates were analyzed. While each substrate was rested horizontal with the front surface facing upward, the arithmetic average roughness (Sa) of the first curved surface from the front surface to the position of 50 μm below the front surface was measured by an atomic force microscope (Park NX20 by Park Systems), finding a Sa value of 0.25 nm in a measurement area of 1 μm squares.

After the completion of polishing, 50 out of 100 glass substrates were dip-cleaned and dried, with their one side surface kept horizontal. The dry substrates were visually inspected for defects under a condensing lamp. For all 50 substrates, neither contaminants nor stains were found on the outer periphery of the front surface.

The remaining 50 glass substrates were subjected to single-substrate cleaning. That is, each substrate was rested horizontal with the front surface facing upward and subjected to cleaning. SPM cleaning solution (sulfuric acid-hydrogen peroxide mixture) was supplied onto the front surface while rotating the substrate at 100 rpm. Thereafter, ultrasonified ultrapure water was supplied onto the front surface while rotating the substrate at 100 rpm. The ultrapure water supply was stopped, after which the rotational speed was increased to 1,200 rpm to spin off the ultrapure water remaining on the front surface by a centrifugal force, thus drying the glass substrate.

After the single-substrate cleaning, the front surface of the glass substrate was inspected in a region of 146 mm squares for defects using a laser confocal optical defect inspection system (by Lasertec Corp.) having a high sensitivity sufficient to detect PSL particles of 50 nm. For all 50 glass substrates, no defects having a size of 100 nm or larger were found. Neither particles nor water marks were found on the outer periphery of the front surface.

The cleaned substrates were measured for flatness using an optical interference flatness meter (Ultra Flat M200 by TROPEL). For all the glass substrates, the front surface excluding a region extending 2 mm inward from the outline of the substrate had a flatness of up to 5 μm.

Example 2

As in Example 1, 100 starting rectangular substrates having outer dimensions of 152 mm were sliced from a synthetic quartz glass ingot, and lapped; the side surfaces and corners were ground and chamfered to define side surfaces and chamfered surfaces; four side surfaces were mirror finished using a brush in combination with an abrasive, thereby defining side surface and chamfered surface contours. In this Example, the brush having nylon bristles with a diameter of 60 μm and cerium oxide based abrasive were used, and 100 glass substrates were stacked at a spacing of 200 μm (corresponding to 3.3 times the bristle diameter).

At the end of mirror finishing, each substrate had a thickness of about 6.45 mm. As in Example 1, 10 substrates were randomly taken out of 100 substrates and measured for the shape of the chamfered surface and the vicinity. When the substrate was rested horizontal with the front surface facing upward, the average gradient of the first curved surface ranging from the front surface to the position of 50 μm below the front surface was 23% at maximum among 10 substrates. When the substrate was rested horizontal with at least one side surface facing upward, the average gradient of the second curved surface ranging from the at least one side surface to the position of 50 μm below the at least one side surface was 39% at minimum among 10 substrates.

The substrates were subjected to rough polishing and final precise polishing as in Example 1.

After the completion of polishing, 10 substrates were analyzed as in Example 1. While each substrate was rested horizontal with the front surface facing upward, the arithmetic average roughness (Sa) of the first curved surface ranging from the front surface to the position of 50 μm below the front surface was measured, finding a Sa of 0.28 nm.

After the completion of polishing, 50 out of 100 glass substrates were dip-cleaned and dried, with their one side surface kept horizontal. The dry substrates were visually inspected for defects under a condensing lamp. For all 50 substrates, neither contaminants nor stains were found on the outer periphery of the front surface.

The remaining 50 glass substrates were subjected to single-substrate cleaning as in Example 1. That is, each substrate was rested horizontal with the front surface facing upward and subjected to cleaning. Thereafter, it was inspected for defects by a defect inspection system. For all 50 glass substrates, no defects having a size of 100 nm or larger were found. Neither particles nor water marks were found on the outer periphery of the front surface.

The cleaned substrates were measured for flatness as in Example 1. For all the glass substrates, the front surface excluding a region extending 2 mm inward from the outline of the substrate had a flatness of up to 5 μm.

Example 3

As in Example 1, 100 starting rectangular substrates having outer dimensions of 152 mm were sliced from a synthetic quartz glass ingot, and lapped; the side surfaces and corners were ground and chamfered to define side surfaces and chamfered surfaces; four side surfaces were mirror finished using a brush in combination with an abrasive, thereby defining side surface and chamfered surface contours. In this Example, the brush having nylon bristles with a diameter of 60 μm and cerium oxide based abrasive were used, and 100 glass substrates were stacked at a spacing of 200 μm (corresponding to 3.3 times the bristle diameter).

Thereafter the substrates were polished by abutting a polishing platen having a diameter of 300 mm against the side surface. Polishing was performed by rotating the platen having a rigid urethane pad secured thereto at 70 rpm and under a polishing pressure of 150 gf/cm$^2$, and supplying a cerium oxide abrasive (A-10 by Showa Denko K.K.).

At the end of mirror finishing, the substrate had a thickness of about 6.45 mm. Ten substrates were randomly taken out of 100 substrates and measured for the shape of the chamfered surface and the vicinity. When the substrate was rested horizontal with the front surface facing upward, the average gradient of the first curved surface ranging from the front surface to the position of 50 μm below the front surface was 20% at maximum among 10 substrates. When the substrate was rested horizontal with at least one side surface facing upward, the average gradient of the second curved surface ranging from the at least one side surface to the position of 50 μm below the at least one side surface was 43% at minimum among 10 substrates.

The side surface and the chamfered surface disposed adjacent to the front surface of 10 glass substrates were measured for an arithmetic average roughness (Ra) of roughness curve by a surface texture and contour measuring instrument Surfcom 1900 (Tokyo Seimitsu Co., Ltd.) according to JIS B0601-1994. The Ra was 0.01 μm on the side surface and 0.03 μm on the chamfered surface.

The substrates were subjected to rough polishing and final precise polishing as in Example 1.

After the completion of polishing, 10 substrates were analyzed as in Example 1. While each substrate was rested horizontal with the front surface facing upward, the arithmetic average roughness (Sa) of the first curved surface ranging from the front surface to the position of 50 μm below the front surface was measured, finding a Sa of 0.26 nm.

After the completion of polishing, 50 out of 100 glass substrates were dip-cleaned and dried, with their one side surface kept horizontal. The dry substrates were visually inspected for defects under a condensing lamp. For all 50 substrates, neither contaminants nor stains were found on the outer periphery of the front surface.

The remaining 50 glass substrates were subjected to single-substrate cleaning as in Example 1. That is, each substrate was rested horizontal with the front surface facing upward and subjected to cleaning. Thereafter, it was inspected for defects by a defect inspection system. For all 50 glass substrates, no defects having a size of 100 nm or larger were found. Neither particles nor water marks were found on the outer periphery of the front surface.

The cleaned substrates were measured for flatness as in Example 1. For all the glass substrates, the front surface excluding a region extending 2 mm inward from the periphery of the substrate had a flatness of up to 5 μm.

Comparative Example 1

As in Example 1, 100 starting rectangular substrates having outer dimensions of 152 mm were sliced from a synthetic quartz glass ingot, and lapped; the side surfaces and corners were ground and chamfered to define side surfaces and chamfered surfaces; four side surfaces were mirror finished using a brush in combination with an abrasive, thereby defining side surface and chamfered surface contours. In this Example, the brush having nylon bristles with a diameter of 60 μm and cerium oxide based abrasive were used, and 100 glass substrates were stacked at a spacing of 1,000 μm (corresponding to 16.7 times the bristle diameter).

At the end of mirror finishing, the substrate had a thickness of about 6.45 mm. As in Example 1, 10 substrates were randomly taken out of 100 substrates and measured for the shape of the chamfered surface and the vicinity. When the substrate was rested horizontal with the front surface facing upward, the average gradient of the first curved surface ranging from the front surface to the position of 50 μm below the front surface was 37% at maximum among 10 substrates. When the substrate was rested horizontal with at least one side surface facing upward, the average gradient of the second curved surface ranging from the at least one side surface to the position of 50 μm below the at least one side surface was 41% at minimum among 10 substrates. The side surface and the chamfered surface disposed adjacent to the front surface of 10 glass substrates were measured for an arithmetic average roughness (Ra) of roughness curve as in Example 3, finding a Ra of 0.03 μm on the side surface and 0.04 μm on the chamfered surface.

The substrates were subjected to rough polishing and final precise polishing as in Example 1.

After the completion of polishing, 50 out of 100 glass substrates were subjected to single-substrate cleaning and inspected for defects as in Example 1. Five out of 50 substrates were rejected because defects having a size of 100 nm or larger were detected. For all 5 substrates, the defects were particles and water marks and detected on the outer periphery of the front surface. When the substrate was rested with the front surface horizontal, the gradient between the front surface and the chamfered surface was sharp. It is thus believed that surface tension acts to prevent the cleaning chemical solution from leaving the front surface by a centrifugal force, which solution caused particles and water marks.

Japanese Patent Application No. 2016-164213 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A rectangular glass substrate having a front surface, a back surface, four side surfaces, and eight chamfered surfaces defined between the front surface and each of the side surfaces and between the back surface and each of the side surfaces, wherein the substrate includes a first curved surface along an edge line between the front surface and at least one of the chamfered surfaces disposed adjacent thereto, having an average gradient of up to 25% in a range from the front surface to a position of 50 μm below the front surface when the substrate is rested horizontal with the front surface facing upward, and a second curved surface along an edge line between at least one of the four side surfaces and one of the chamfered surfaces each disposed adjacent to the front surface, having an average gradient of at least 30% in a range from the at least one side surface to a position of 50 μm below the at least one side surface when the substrate is rested horizontal with the at least one side surface facing upward, the substrate has a thickness of at least 6 mm, and each of the side surfaces includes a plane which is perpendicular to a plane including the front surface and a plane including the back surface in the rectangular glass.

2. The rectangular glass substrate of claim 1 wherein the first curved surface has an arithmetic average roughness (Sa) of up to 2 nm.

3. The rectangular glass substrate of claim 1 wherein an arithmetic average roughness (Ra) of roughness curve between at least one of the side surfaces and at least one of the chamfered surfaces each disposed adjacent to the front-surface is up to 0.1 μm.

4. The rectangular glass substrate of claim 1 wherein the front surface of the substrate excluding a region extending 2 mm inside from its outer periphery has a flatness of up to 5 μm.

5. A method for preparing the rectangular glass substrate of claim 1, comprising the steps of:

stacking a plurality of starting rectangular glass substrates each having a front surface, a back surface, four side surfaces and eight chamfered surfaces defined between the front surface and each of the side surfaces and between the back surface and each of the side surfaces, with spacing, such that the front surface of one substrate is opposed to the back surface of an adjacent substrate; and polishing the side surfaces and the chamfered surfaces of the stacked starting substrates with a brush, the brush comprising a cylindrical base and a multiplicity of bristles extending radially from the base, each bristle having a diameter of up to 0.2 mm and the spacing between the starting substrates being 2 to 10 times the bristle diameter, wherein each of the side surfaces includes a plane which is perpendicular to a plane including the front surface and a plane including the back surface in the starting rectangular glass, and the substrate has a thickness of at least 6 mm.

6. The method of claim 5, further comprising the step of polishing the side surfaces of the stacked starting substrates by abutting a platen having a polishing pad secured thereto against the side surfaces.

* * * * *